United States Patent
Chu et al.

(10) Patent No.: US 10,714,466 B1
(45) Date of Patent: Jul. 14, 2020

(54) LAYOUT PATTERN FOR MAGNETORESISTIVE RANDOM ACCESS MEMORY

(71) Applicant: UNITED MICROELECTRONICS CORP., Hsin-Chu (TW)

(72) Inventors: Chung-Liang Chu, Kaohsiung (TW); Chih-Hsien Tang, Tainan (TW); Yu-Ruei Chen, New Taipei (TW); Ya-Huei Tsai, Tainan (TW); Rai-Min Huang, Taipei (TW); Chueh-Fei Tai, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/255,786

(22) Filed: Jan. 23, 2019

(30) Foreign Application Priority Data

Dec. 27, 2018 (CN) .......................... 2018 1 1610931

(51) Int. Cl.
| H01L 27/22 | (2006.01) |
| H01L 27/02 | (2006.01) |
| G03F 1/36 | (2012.01) |
| H01L 43/12 | (2006.01) |
| H01L 43/02 | (2006.01) |

(52) U.S. Cl.
CPC ............ *H01L 27/0207* (2013.01); *G03F 1/36* (2013.01); *H01L 27/222* (2013.01); *H01L 27/224* (2013.01); *H01L 27/228* (2013.01); *H01L 43/02* (2013.01); *H01L 43/12* (2013.01)

(58) Field of Classification Search
CPC . H01L 27/0207; H01L 27/222; H01L 27/224; H01L 27/228; H01L 43/02; H01L 43/12; G11C 11/161
See application file for complete search history.

(56) References Cited

U.S. PATENT DOCUMENTS

| 7,635,884 B2 * | 12/2009 | Gaidis .................... B82Y 10/00 257/295 |
| 8,865,481 B2 | 10/2014 | Li et al. |
| 2007/0187785 A1 * | 8/2007 | Hung ...................... H01L 43/08 257/421 |
| 2007/0223270 A1 * | 9/2007 | Hung ...................... G11C 11/14 365/171 |
| 2013/0341801 A1 * | 12/2013 | Satoh ..................... H01L 43/02 257/774 |
| 2015/0061025 A1 * | 3/2015 | Nakazawa ........ H01L 21/76802 257/368 |
| 2015/0249204 A1 * | 9/2015 | Ha .......................... H01L 43/02 257/421 |
| 2017/0092851 A1 * | 3/2017 | Han ....................... H01L 43/12 |
| 2017/0110653 A1 * | 4/2017 | Seo ....................... G11C 11/161 |
| 2017/0263677 A1 * | 9/2017 | Sugiura ................. H01L 27/228 |

* cited by examiner

*Primary Examiner* — Stephen W Smoot
(74) *Attorney, Agent, or Firm* — Winston Hsu

(57) ABSTRACT

A layout pattern for magnetoresistive random access memory (MRAM) includes: a first magnetic tunneling junction (MTJ) pattern on a substrate; a second MTJ pattern adjacent to the first MTJ pattern; and a first metal interconnection pattern between the first MTJ pattern and the second MTJ pattern, wherein the first MTJ pattern, the first metal interconnection pattern, and the second MTJ pattern comprise a staggered arrangement.

18 Claims, 3 Drawing Sheets

US 10,714,466 B1

LAYOUT PATTERN FOR MAGNETORESISTIVE RANDOM ACCESS MEMORY

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a layout pattern for magnetoresistive random access memory (MRAM) includes: a first magnetic tunneling junction (MTJ) pattern on a substrate; a second MTJ pattern adjacent to the first MTJ pattern; and a first metal interconnection pattern between the first MTJ pattern and the second MTJ pattern, wherein the first MTJ pattern, the first metal interconnection pattern, and the second MTJ pattern comprise a staggered arrangement.

According to another aspect of the present invention, a layout pattern for magnetoresistive random access memory (MRAM) includes: a magnetic tunneling junction (MTJ) pattern on a substrate, wherein the MTJ pattern comprises a first L-shape; and a first metal interconnection pattern adjacent to the MTJ pattern, wherein the first metal interconnection pattern comprises a second L-shape. Preferably, the MTJ pattern includes a first portion extending along a first direction and a second portion extending along a second direction and the first metal interconnection pattern includes a third portion extending along the first direction and a fourth portion extending along the second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
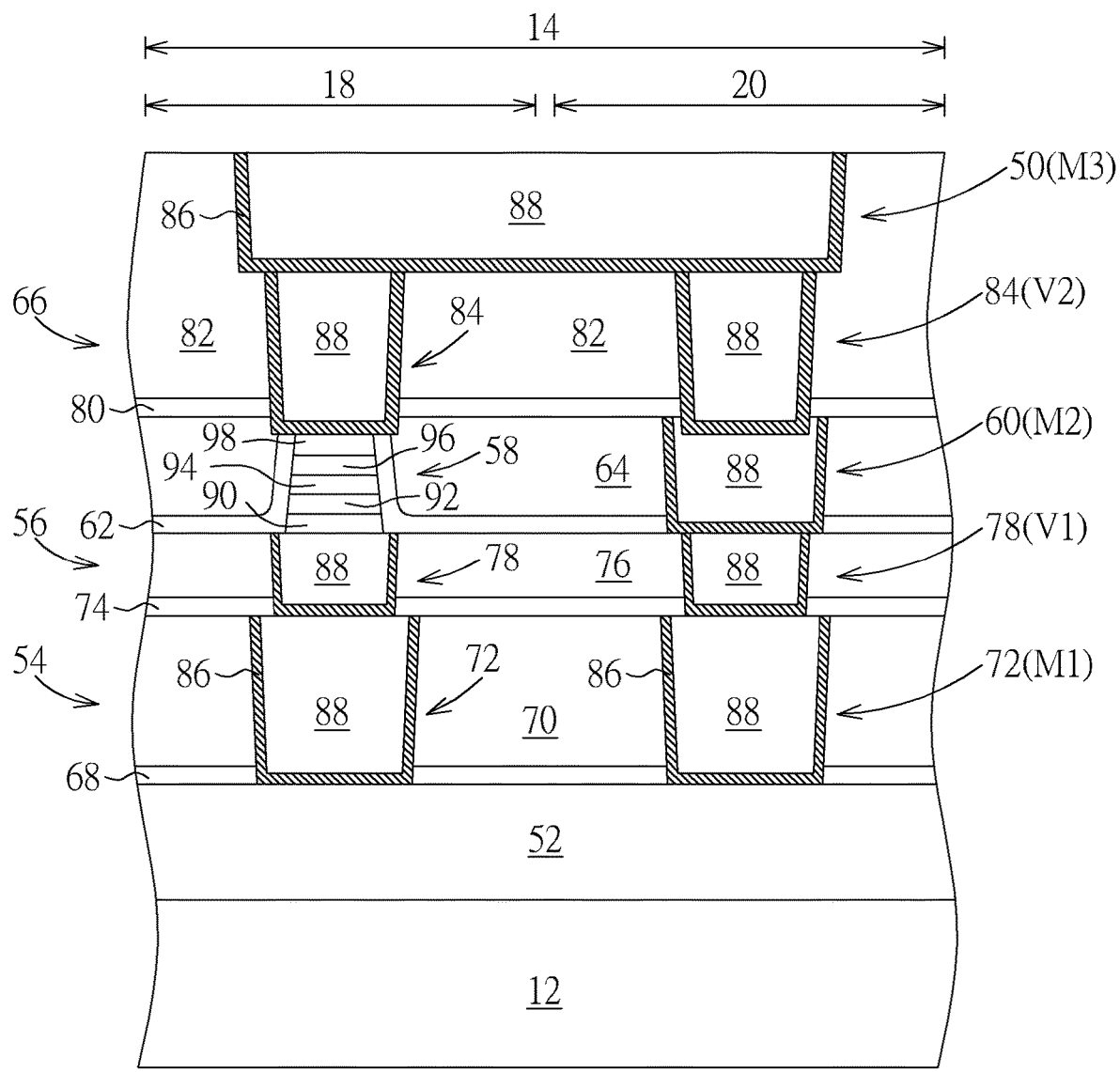
FIG. 1 illustrates a structural view of a MRAM device according to an embodiment of the present invention.

Referring to FIG. 1, FIG. 1 illustrates a structural view of a semiconductor device, or more specifically a MRAM device according to an embodiment of the present invention. As shown in FIG. 1, the MRAM device preferably includes a substrate 12 made of semiconductor material, in which the semiconductor material could be selected from the group consisting of silicon (Si), germanium (Ge), Si—Ge compounds, silicon carbide (SiC), and gallium arsenide (GaAs). An array region 14 and a periphery region (not shown) surrounding the array region 14 are defined on the substrate 12, in which the array region 14 in this embodiment could also be referred to as a MRAM macro region and the array region 14 could further include a MRAM region 18 and a logic region 20.

Active devices such as metal-oxide semiconductor (MOS) transistors, passive devices, conductive layers, and interlayer dielectric (ILD) layer 52 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacers, epitaxial layers, and contact etch stop layer (CESL). The ILD layer 52 could be formed on the substrate 12 to cover the MOS transistors, and a plurality of contact plugs (not shown) could be formed in the ILD layer 52 to electrically connect to the gate structure and/or source/drain region of MOS transistors. Since the fabrication of planar or non-planar transistors and ILD layer is well known to those skilled in the art, the details of which are not explained herein for the sake of brevity.

The semiconductor device also includes metal interconnect structures 54, 56 disposed on the ILD layer 52, MTJs 58 disposed on metal interconnect structure 56 on the periphery region 16 and the MRAM region 18, metal interconnection 60 disposed on the metal interconnect structure 56 on the logic region 20, cap layer 62 disposed on sidewalls of the MTJs 58, inter-metal dielectric (IMD) layer 64 disposed around the cap layer 62, and another metal interconnect structure 66 disposed on the MTJs 58 and the metal interconnection 60.

In this embodiment, the metal interconnect structure 54 includes a stop layer 68, an IMD layer 70, and a plurality of metal interconnections 72 embedded within the stop layer 68 and the IMD layer 70, the metal interconnect structure 56 includes a stop layer 74, an IMD layer 76, and a plurality of metal interconnections 78 embedded in the stop layer 74 and the IMD layer 76, and the metal interconnect structure 66 includes a stop layer 80, an IMD layer 82, and metal interconnections 84 embedded in the stop layer 80 and the IMD layer 82.

In this embodiment, each of the metal interconnections 50, 60, 72, 78, 84 within the metal interconnect structures 54, 56, 66 could be fabricated according to a single damascene or dual damascene process and embedded in the IMD layers 70, 76, 82 and/or stop layers 68, 74, 80 and electrically connected to each other. For instance, each of the metal interconnections 72 preferably include a trench conductor, each of the metal interconnections 78 preferably include a via conductor, each of the metal interconnections 84 preferably include a via conductor, the metal interconnection 60 preferably includes a trench conductor, and the metal interconnection 50 preferably includes a trench conductor. Preferably, the metal interconnections 72 are also referred to as first level metal interconnections M1, the metal interconnections 78 are also referred to as first level vias V1, the metal interconnection 60 is referred to as second level metal interconnection M2, the metal interconnections 84 are referred to as second level vias V2, and the metal interconnection 50 is referred to as the third level metal interconnection M3.

Moreover, each of the metal interconnections 72, 78, 84 could further includes a barrier layer 86 and a metal layer 88, in which the barrier layer 86 could be selected from the group consisting of titanium (Ti), titanium nitride (TiN), tantalum (Ta), and tantalum nitride (TaN) and the metal layer 88 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 88 are preferably made of copper, the IMD layers 70, 76, 82 are preferably made of silicon oxide, and the stop layers 68, 74, 80 are preferably made of nitrogen doped carbide (NDC), silicon nitride, silicon carbon nitride (SiCN), or combination thereof.

In this embodiment, the formation of the MTJs 58 could be accomplished by sequentially forming a first electrode layer 90, a fixed layer 92, a free layer 94, a capping layer 96, and a second electrode layer 98 on the IMD layer 76. In this embodiment, the first electrode layer 90 and the second electrode layer 98 are preferably made of conductive material including but not limited to for example Ta, Pt, Cu, Au, Al, or combination thereof. The fixed layer 92 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 92 is formed to fix or limit the direction of magnetic moment of adjacent layers. The free layer 94 could be made of ferromagnetic material including but not limited to for example iron, cobalt, nickel, or alloys thereof such as cobalt-iron-boron (CoFeB), in which the magnetized direction of the free layer 94 could be altered freely depending on the influence of outside magnetic field. The capping layer 96 could be made of insulating material including but not limited to for example oxides such as aluminum oxide ($AlO_x$) or magnesium oxide (MgO).

Next, a pattern transfer or photo-etching process is conducted by using a patterned resist (not shown) as mask to remove part of the second electrode layer 98, part of the capping layer 96, part of the free layer 94, part of the fixed layer 92, and part of the first electrode layer 90 to form MTJ 58 on the MRAM region 18, in which the MTJ 58 electrically connects or more specifically directly contacts the metal interconnection 78 underneath.

Figure 2:
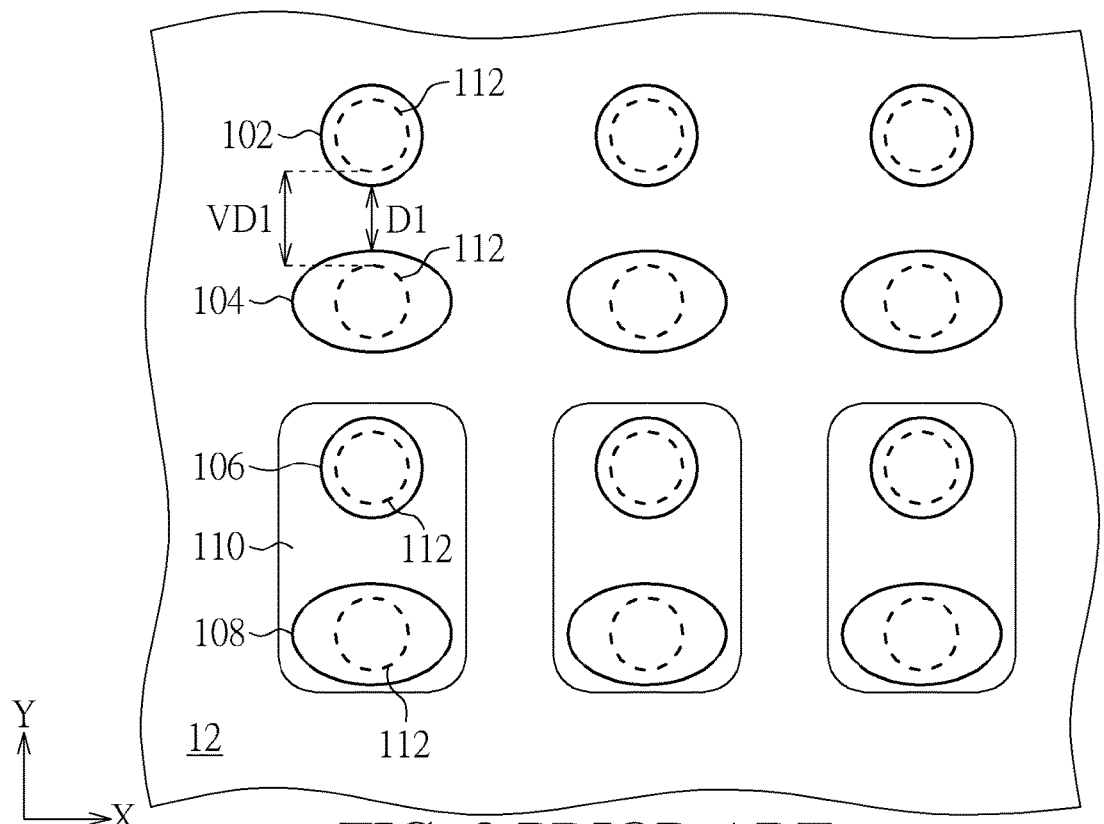
FIG. 2 illustrates a layout pattern of adjacent MTJs and metal interconnections within a MRAM unit according to a conventional art.

Referring to FIG. 2, FIG. 2 illustrates a layout pattern of adjacent MTJs and metal interconnections within a MRAM unit generated after optical proximity correction (OPC) process according to a conventional art. As shown in FIG. 2, the layout pattern of the MRAM unit preferably includes multiple columns of pattern combination constituted by MTJ patterns and metal interconnection patterns arranged according to an array, in which each column includes a plurality of MTJ patterns, a plurality of metal interconnection patterns, and a plurality of via patterns arranged according to a straight line. For instance, the layout pattern on the left column preferably includes a first MTJ pattern 102, a first metal interconnection pattern 104, a second MTJ pattern 106 (such as the MTJ 58 shown in FIG. 1), a second metal interconnection pattern 108 (such as the second level metal interconnection M2), a third metal interconnection pattern 110 (such as the third level metal interconnection M3), and via patterns 112 all arranged according to a straight line manner on the substrate 12. Preferably, the first MTJ pattern 102, the first metal interconnection pattern 104, the second MTJ pattern 106, and the second metal interconnection pattern 108 are disposed according to a staggered arrangement and constitute a straight line altogether from a top view perspective, and the via patterns 112 overlapping each of the first MTJ pattern 102, the first metal interconnection pattern 104, the second MTJ pattern 106, and the second metal interconnection pattern 108 also constitute a straight line.

It should be noted that since the aforementioned embodiment of placing the MTJ patterns, metal interconnection patterns, and via patterns along a straight line significantly could shorten the distance between adjacent metal interconnections and via holes such as by shorten the distance D1 between adjacent MTJ and metal interconnection and distance VD1 between adjacent via holes thereby resulting in contamination, the following embodiments of the present invention preferably adjust the arrangements among MTJ patterns, metal interconnection patterns, and/or via patterns so that the three types of patterns would not be too close to each other thereby minimizing the chance of contamination.

Figure 3:
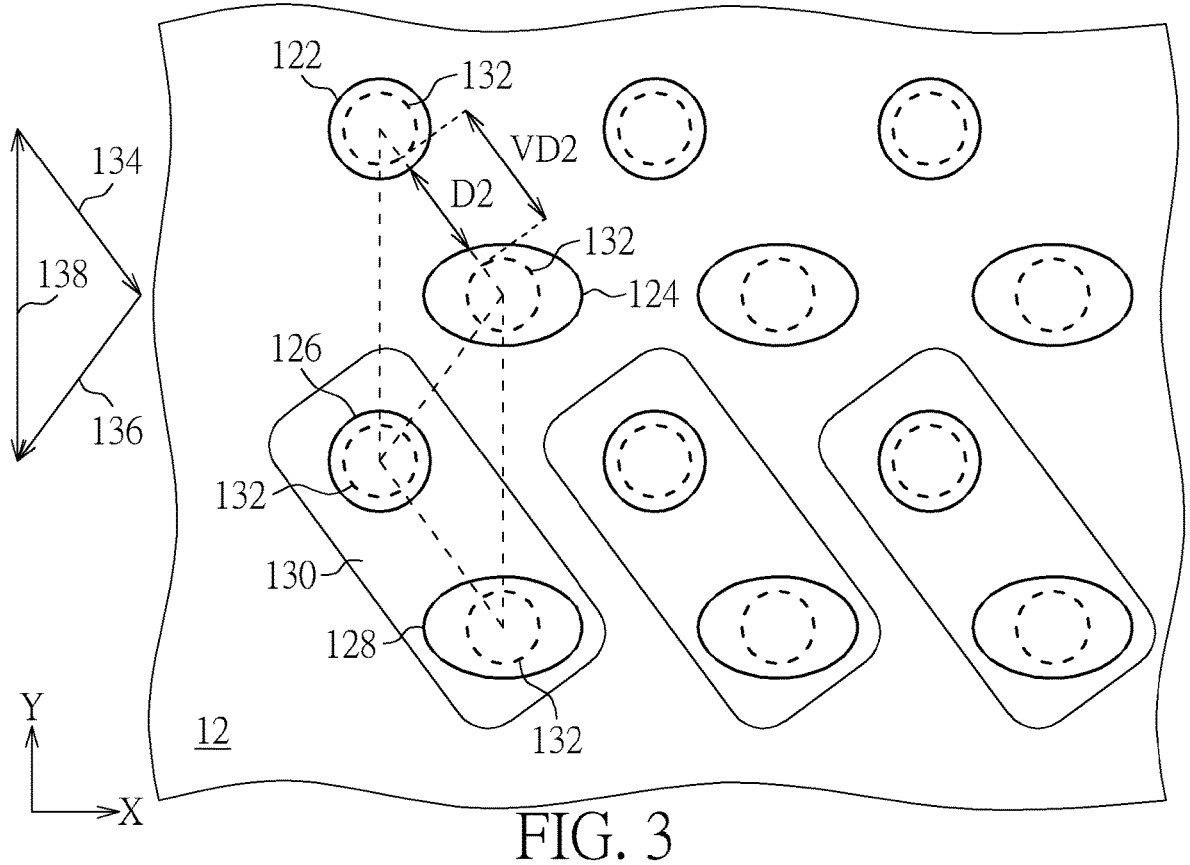
FIG. 3 illustrates a layout pattern of adjacent MTJs and metal interconnections within a MRAM unit according to an embodiment of the present invention.

Referring to FIG. 3, FIG. 3 illustrates a layout pattern of adjacent MTJs and metal interconnections within a MRAM unit generated after optical proximity correction (OPC) process. As shown in FIG. 3, the layout pattern of the MRAM unit preferably includes multiple columns of pattern combination constituted by MTJ patterns and metal interconnection patterns arranged according to an array, in which each column includes a plurality of MTJ patterns, a plurality of metal interconnection patterns, and a plurality of via patterns. For instance, the layout pattern on the left column preferably includes a first MTJ pattern 122 disposed on the substrate 12, a second MTJ pattern 126 (such as the MTJ 58 shown in FIG. 1) disposed adjacent to the first MTJ pattern 122, a first metal interconnection pattern 124 disposed between the first MTJ pattern 122 and second MTJ pattern 126, a second metal interconnection pattern 128 (such as the second level metal interconnection M2 shown in FIG. 1) disposed adjacent to the second MTJ pattern 126, a third metal interconnection pattern 130 (such as the third level metal interconnection M3 shown in FIG. 1) surrounding the second MTJ pattern 126 and second metal interconnection pattern 128, and via patterns 132 overlapping the first MTJ pattern 122, the first metal interconnection pattern 124, the second MTJ pattern 126, and the second metal interconnection pattern 128, in which the first MTJ pattern 122, the first metal interconnection pattern 124, the second MTJ pattern 126, and the second metal interconnection pattern 128 are arranged according to a staggered arrangement.

Specifically, the first metal interconnection pattern 124 is disposed along a first direction 134 relative to the first MTJ pattern 122, the second MTJ pattern 126 is disposed along a second direction 136 relative to the first metal interconnection pattern 124, the second MTJ pattern 126 is disposed along a third direction 138 (such as Y-direction) relative to the first MTJ pattern 122, and the second metal interconnection pattern 128 is also disposed along the same first direction 134 relative to the second MTJ pattern 126 while the second metal interconnection pattern 128 is also disposed along the third direction 138 relative to the first metal interconnection pattern 124, in which the angle included by the first direction 134 and the third direction 138 is less than 90 degrees. Viewing from an overall perspective, the positions of the first MTJ pattern 122, the first metal interconnection pattern 124, and the second MTJ pattern 126, such as the central points of the first MTJ pattern 122, first metal interconnection pattern 124, and second MTJ pattern 126 together constitute a triangle while the central points the first metal interconnection pattern 124, second MTJ pattern 126, and second metal interconnection pattern 128 also constitute another triangle. Preferably, each of the first MTJ pattern 122 and the second MTJ patter 126 includes a circle or circular pattern, each of the first metal interconnection pattern 124 and second metal interconnection pattern 128 includes an ellipse or elliptical pattern, and the third metal interconnection pattern 130 includes a rectangle or rectangular pattern.

Viewing from another perspective, the first direction 134 extended from the center or central point of the first MTJ pattern 122 to the central point of the first metal interconnection pattern 124, the second direction 136 extended from the central point of the first metal interconnection 124 to the central point of the second MTJ pattern 126, and the third direction 138 extended from the central point of the first MTJ pattern 122 to the central point of the second MTJ pattern 126 preferably constitute a triangle. Similarly, the second direction 136 extended from the central point of the first metal interconnection pattern 124 to the central point of the second MTJ pattern 126, the first direction 134 extended from the central point of the second MTJ pattern 126 to the central point of the second metal interconnection pattern 128, and the third direction 138 extended from the central point of the first metal interconnection pattern 124 to the central point of the second metal interconnection pattern 128 also constitute another triangle. It should be noted that the triangle constituted by the aforementioned combination of patterns or the three directions 134, 136, 138 could include all types of triangles such as equilateral triangle, isosceles triangle, right angle triangle, or any irregular triangle, the via patterns 132 could also be arranged in the same manner as the MTJ patterns and metal interconnections disclosed above and the detailed of which are not explained herein for the sake of brevity.

It should be noted that by positioning the MTJ patterns and the metal interconnection patterns according to a staggered manner in this embodiment, a shortest distance D2 measured from the edge of the first MTJ pattern 122 to the edge of the first metal interconnection pattern 124 would then correspond to a hypotenuse of a triangle as opposed to a cathetus as disclosed in the embodiment shown in FIG. 2. As a result, the shortest distance D2 between the edge of each of the MTJ patterns and the edge of each of the metal interconnection patterns would be greater than the shortest distance D1 between the MTJ patterns and metal interconnection patterns disclosed in the embodiment shown in FIG. 2. Similarly, the shortest distance VD2 measured from the edge of the via pattern 132 overlapping the first MTJ pattern 122 to the edge of the via pattern 132 overlapping the metal interconnection pattern 124 would also be greater than the shortest distance VD1 between adjacent via patterns shown in FIG. 2. By following this design it would be desirable to increase the distance between adjacent MTJs and metal interconnections thereby avoiding contamination.

Figure 4:
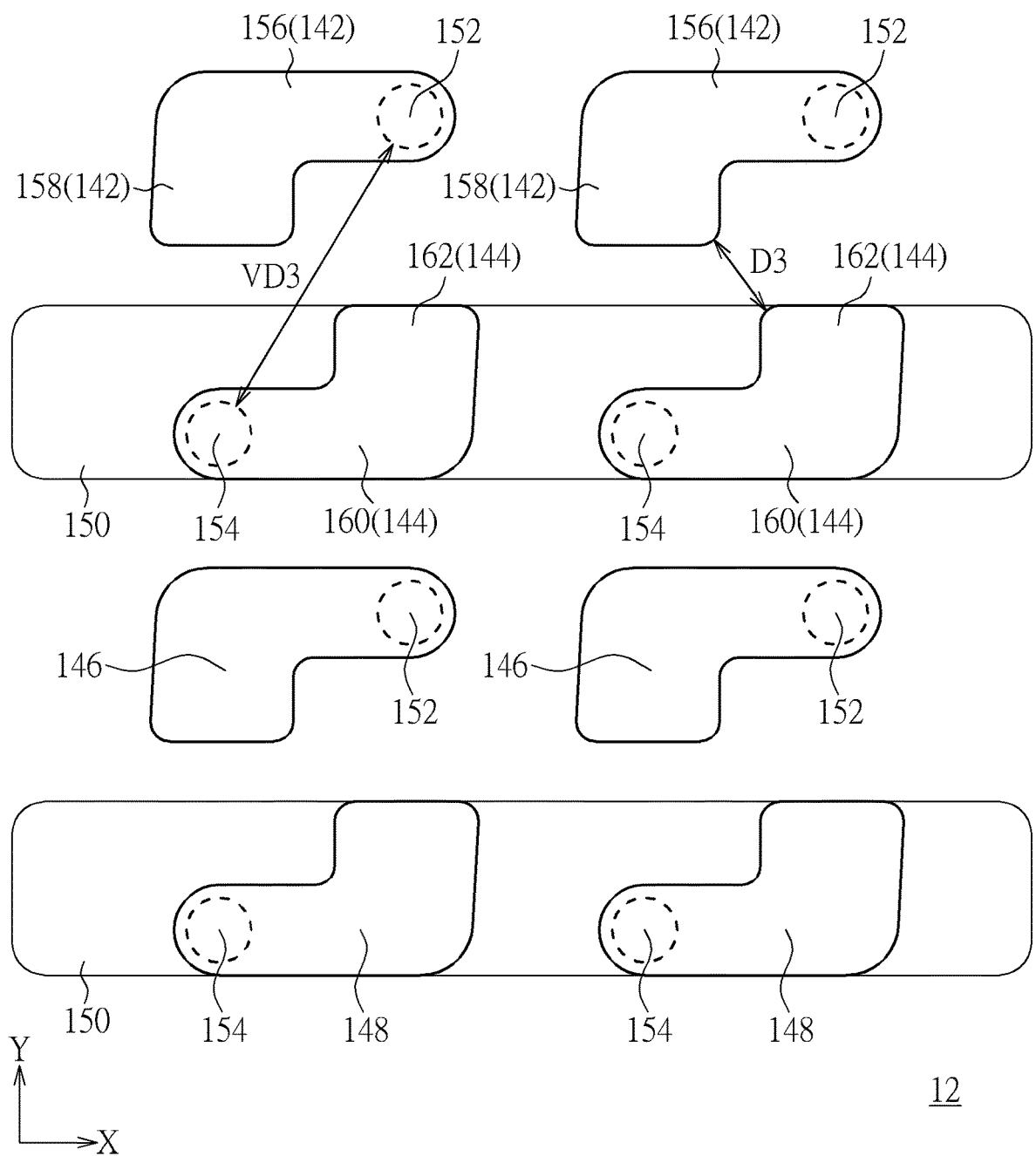
FIG. 4 illustrates a layout pattern of adjacent MTJs and metal interconnections within a MRAM unit according to an embodiment of the present invention.

Referring to FIG. 4, FIG. 4 illustrates a layout pattern of adjacent MTJs and metal interconnections within a MRAM unit generated after optical proximity correction (OPC) process. As shown in FIG. 4, the layout pattern of the MRAM unit preferably includes multiple columns of pattern combinations constituted by MTJ patterns and metal interconnection patterns arranged according to an array, in which each column includes a plurality of MTJ patterns, a plurality of metal interconnection patterns, and a plurality of via patterns. For instance, the layout pattern on the left column preferably includes a first metal interconnection pattern 142 (such as the second level metal interconnection M2 shown in FIG. 1), a first MTJ pattern 144 (such as the MTJ 58 shown in FIG. 1), a second metal interconnection pattern 146, and a second MTJ pattern 148 disposed according to a staggered manner on the substrate 12. Preferably, third metal interconnection patterns 150 (such as the first level metal interconnection M1 shown in FIG. 1) is disposed adjacent to two sides of the first MTJ pattern 144 and second MTJ patterns 148, each of the first metal interconnection pattern 142 and second metal interconnection pattern 146 includes a first via pattern 152, and each of the first MTJ pattern 144 and second MTJ pattern 148 includes a second via pattern 154. It should be noted that each of the MTJ patterns such as the first MTJ pattern 144 in this embodiment preferably corresponds to the MTJ 58 shown in FIG. 1 while each of the metal interconnection patterns such as the first metal interconnection pattern 142 corresponds to the second level metal interconnection M2 shown in FIG. 1, hence the two elements are preferably disposed on the same level such as both within the same IMD layer.

In this embodiment, each of the first MTJ pattern 144 and second MTJ pattern 148 includes a first L-shape, each of the first metal interconnection pattern 142 and second metal interconnection pattern 146 includes a second L-shape, the third metal interconnection pattern 150 includes a rectangular shape, and each of the first via pattern 152 and second via pattern 154 includes a circle, in which the first L-shape and the second L-shape are disposed diagonally.

Viewing from a more detailed perspective, the first metal interconnection pattern 142 preferably includes a first portion 156 extending along a first direction (such as X-direction) and a second portion 158 extending along a second direction (such as Y-direction), and the first MTJ pattern 144 includes a third portion 160 extending along the same first direction (such as X-direction) and a fourth portion 162 extending along the second direction. Preferably, the end of the first portion 156 includes the aforementioned first via pattern 152, the end of the third portion 160 includes the aforementioned second via pattern 154, and the first via pattern 152 and the second via pattern 154 are positioned diagonally.

It should be noted that since the first MTJ pattern 144 and the first metal interconnection pattern 142 are diagonally positioned L-shaped patterns, not only the shortest distance D3 measuring from the edge of the first metal interconnection pattern 142 to the edge of the first MTJ pattern 144 could be greater than the shortest distance D1 measuring from the edge of the MTJ pattern to the edge of the metal interconnection pattern in the embodiment shown in FIG. 2, the shortest distance VD3 measuring from the edge of the first via pattern 152 to the edge of the second via pattern 154 could also be greater than the shortest distance VD1 between adjacent via patterns in FIG. 2. By doing so, the gap or distance between adjacent MTJs and metal interconnections could be increased significantly thereby preventing the chance of contamination.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern for magnetoresistive random access memory (MRAM), comprising:
   a first magnetic tunneling junction (MTJ) pattern on a substrate;
   a second MTJ pattern adjacent to the first MTJ pattern; and
   a first metal interconnection pattern between the first MTJ pattern and the second MTJ pattern, wherein the first MTJ pattern, the first metal interconnection pattern, and the second MTJ pattern comprise a staggered arrangement, the first MTJ pattern comprises a circle while the first metal interconnection pattern comprises an ellipse, and the first MTJ pattern and the second MTJ pattern are on a same level.

2. The layout pattern for MRAM of claim 1, wherein the first metal interconnection pattern is disposed along a first direction relative to the first MTJ pattern and the second MTJ pattern is disposed along a second direction relative to the first metal interconnection.

3. The layout pattern for MRAM of claim 2, wherein the second MTJ pattern is disposed along a third direction relative to the first MTJ pattern.

4. The layout pattern for MRAM of claim 3, wherein an angle included by the first direction and the third direction is less than 90 degrees.

5. The layout pattern for MRAM of claim 3, wherein the first direction, the second direction, and the third direction comprise a triangle.

6. The layout pattern for MRAM of claim 3, further comprising a second metal interconnection pattern disposed along the first direction relative to the second MTJ pattern.

7. The layout pattern for MRAM of claim 6, wherein the second metal interconnection pattern is disposed along the third direction relative to the first metal interconnection pattern.

8. The layout pattern for MRAM of claim 6, further comprising a third metal interconnection pattern disposed along the first direction and around the second MTJ pattern and the second metal interconnection pattern.

9. The layout pattern for MRAM of claim 8, wherein the third metal interconnection pattern comprises a rectangle.

10. A layout pattern for magnetoresistive random access memory (MRAM), comprising:
    a magnetic tunneling junction (MTJ) pattern on a substrate, wherein the MTJ pattern comprises a first L-shape; and
    a first metal interconnection pattern adjacent to the MTJ pattern, wherein the first metal interconnection pattern comprises a second L-shape.

11. The layout pattern for MRAM of claim 10, wherein the MTJ pattern comprises a first portion extending along a first direction and a second portion extending along a second direction and the first metal interconnection pattern comprises a third portion extending along the first direction and a fourth portion extending along the second direction.

12. The layout pattern for MRAM of claim 11, wherein the first direction is orthogonal to the second direction.

13. The layout pattern for MRAM of claim 11, wherein the first portion comprises a first via pattern and the third portion comprises a second via pattern.

14. The layout pattern for MRAM of claim 13, wherein the first via pattern and the second via pattern are disposed diagonally.

15. The layout pattern for MRAM of claim 14, wherein each of the first via pattern and the second via pattern comprises a circle.

16. The layout pattern for MRAM of claim 10, further comprising a second metal interconnection pattern adjacent to two sides of the MTJ pattern.

17. The layout pattern for MRAM of claim 16, wherein the second metal interconnection pattern comprises a rectangle.

18. The layout pattern for MRAM of claim 10, wherein the MTJ pattern and the first metal interconnection pattern are on a same level.

* * * * *